(12) United States Patent
Maroni et al.

(10) Patent No.: US 6,584,600 B2
(45) Date of Patent: Jun. 24, 2003

(54) HIERARCHICAL METAL ONE USAGE TOOL FOR CHILD LEVEL LEAF CELL

(75) Inventors: Peter D. Maroni, Fort Collins, CO (US); Thomas N Indermaur, Denver, CO (US); James Kwok Yue Wai, Fort Collins, CO (US); Jonathan P Lotz, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 51 days.

(21) Appl. No.: 09/784,662

(22) Filed: Feb. 15, 2001

(65) Prior Publication Data

US 2002/0157064 A1 Oct. 24, 2002

(51) Int. Cl.$^7$ .............................................. G06F 17/50
(52) U.S. Cl. ........................... 716/3; 716/11; 716/18; 716/19
(58) Field of Search ............................... 716/1–18, 19, 716/20, 21

(56) References Cited

U.S. PATENT DOCUMENTS

| | | | |
|---|---|---|---|
| 3,683,416 A | | 8/1972 | Ballas et al. |
| 4,613,940 A | | 9/1986 | Shenton et al. |
| 5,555,201 A | * | 9/1996 | Dangelo et al. ............... 703/13 |
| 5,610,831 A | | 3/1997 | Matsumoto |
| 5,883,811 A | * | 3/1999 | Lam .............................. 716/6 |
| 6,360,356 B1 | * | 3/2002 | Eng ............................. 716/18 |

FOREIGN PATENT DOCUMENTS

| | | |
|---|---|---|
| EP | 0646884 A2 | 4/1995 |
| EP | 0791887 A2 | 8/1997 |

OTHER PUBLICATIONS

Search report issued on Oct. 28, 2002 in counterpart foreign application No. GB 022006.3.

* cited by examiner

*Primary Examiner*—Matthew Smith
*Assistant Examiner*—Paul Dinh

(57) ABSTRACT

Computer-readable media and methods for designing semiconductor artwork. Basic building blocks, or leaf cells, of an existing piece of semiconductor artwork are transferred to a new piece of semiconductor artwork in order to streamline the design process of the new design. In addition to being transferred, the position of METAL 1 layers within the leaf cells are also analyzed to avert possible design rule violations in the new design.

20 Claims, 9 Drawing Sheets

HIERARCHICAL METAL ONE USAGE TOOL FOR CHILD LEVEL LEAF CELL

FIELD OF THE INVENTION

The present invention relates to tools and methods for finding every usage of a leaf cell which is considered the lowest level of artwork abstraction for a semiconductor design within a parent cell, or many parent cells, in a piece of semiconductor artwork and for determining where METAL 1 is used in the parent cell(s). The tools and methods of the present invention provide the ability to move and change the METAL 1 layers such that they may be used in a different piece of semiconductor artwork with the same footprint without affecting the ability of the parent cells to function.

BACKGROUND OF THE INVENTION

Semiconductor artwork can be thought of as a pattern generated to make semiconductor-based electronic devices. Leaf cells are the smallest level of sub-components included in a piece of artwork and the METAL 1 (or first metal layer) of a typical leaf cell 5 is illustrated in FIG. 1. The leaf cell 5 would typically also include active, substrate and polysilicon areas that are not shown in FIG. 1. The typical leaf cell 5 in FIG. 1 implements a simple logic function containing four pieces of METAL 1 within a leaf cell boundary 10. The four pieces of METAL 1 are labeled A, Z, VDD and GND and represent an input 20, an output 30, a power supply 40 and a ground 50, respectively. FIG. 2 illustrates another typical, yet more complex, piece of semiconductor artwork that includes many leaf cells 5 used to form a more intricate design. FIG. 2 also illustrates many small pieces of METAL 1 foreign to the leaf cell itself.

A leaf cell 5 that is positioned as it appears in FIG. 1 is illustrated in one corner of FIG. 2 (Norm). FIG. 2 also illustrates other leaf cells 5 that have been rotated 90° (r90), mirrored across the x-axis (mx), mirrored across the y-axis (my), mirrored across both the x- and y-axes (mxy) and/or "stepped" to form horizontal or vertical series of leaf cells 5. Although the artwork of FIG. 2 is representative of typical semiconductor artwork, other leaf cell and artwork geometries are also known to those skilled in the art.

Parent cells are levels of artwork abstraction that are formed by the combination of different leaf cells and that are therefore more complex than leaf cells. Different levels/orders/complexities of parent cells can exist within a single piece of artwork and allow the artwork to be thought of as a hierarchical structure. For example, FIG. 2 illustrates a first-order parent cell 60 and the leaf cells 5 can be thought of as being part of the first-order parent cell 60 since they are within the first-order parent cell boundary 70.

FIG. 3A illustrates leaf cells 80 (LC) that are part of first-order parent cells such as subblockA1 90, subblockA2 100, and subblockA3 110. FIG. 3B illustrates that subblockA1 90, subblockA2 100, and subblockA3 110 make up blockA 120, a larger, or second-order parent cell. FIG. 3C illustrates that, in turn, blockA 120 makes up, along with blockB 130 and blockC 140, a third-order parent cell, Chip1 150. This hierarchy continues until the highest-order parent cell, the device itself, is reached. The leaf cells 80 are the basic building blocks, the first-level parent cells 90, 100, 110 are slightly larger building blocks, and increasingly larger building blocks can also exist within the artwork. FIGS. 3A–3B illustrate a 3-level hierarchy of a chip design. However, higher levels of hierarchy are also typically used in semiconductor designs.

Much complex semiconductor artwork can be constructed by hierarchical methods wherein the sub-components (leaf cells and lower-level parent cells) are designed once and then simply reproduced repeatedly at various locations until the ultimate device is formed. In many situations, it is also desirable for device designers to use the same leaf cells or parent cells in different pieces of artwork. However, transferring (or porting) leaf cells between different fabrication processes with different design rules and/or transferring parent cells between one piece of artwork and another has, to date, proven to be problematic. Making the porting process more efficient would therefore make artwork design more efficient and would reduce overall fabrication costs of devices.

The terms "porting" and "converting" are clarified at this point in order to avoid ambiguities. The terms "porting" and "converting" refer to taking a design from process A (with design rules A) and converting them to process B (with design rules B) while still having the same functionality and electrical robustness to ensure that the design will work.

Currently, when a component of one piece of artwork is ported and integrated into another piece of artwork, an extensive amount of de-bugging, design-rule checking and trial-and-error testing is required to make the new artwork operable. This is true because, when a leaf cell is used in the new piece of artwork, there is a high probability that the METAL 1 layer in the leaf cell, if moved during the porting process, will overlap with at least a portion of the METAL 1 layer in the new artwork, causing a design rule violation where the leaf cell is used. As the number of leaf cells that are ported increases or the amount of METAL 1 moved within a leaf cell increases, so does the probability that design rules will have been violated. For example, when porting of artwork occurs at the lowest levels (e.g., substrate areas, active areas, polysilicon areas, etc.) of MOSFET designs, the METAL 1 layer routing must frequently be changed in the new design because of the new design rules (i.e. overlap of METAL 1 to active contact may increase, requiring an increase in the size of the METAL 1).

Hence, what is needed are tools and methods for finding every usage of a leaf cell within parent cell(s) in a piece of semiconductor artwork and for determining where METAL 1 is used in the parent cell or many parent cells.

What is also needed are tools and methods that provide the ability to move and change the METAL 1 layers such that they may be used in different pieces of semiconductor artwork without affecting the ability of the new piece of artwork to function in its previous footprint.

SUMMARY OF THE INVENTION

Certain embodiments of the present invention are directed at a script that finds every usage of a leaf cell and then indicates where metal appears within the leaf cell's boundary at all of these instances.

Certain embodiments of the present invention are also directed at methods of transferring a piece of artwork from one device to another that reduce the workload involved in de-bugging and rules-testing that is typically associated with the process.

Certain embodiments of the present invention are directed at methods for taking a piece of artwork from one device, inspecting every single use where the artwork is used, and building a composite block of its environment. Then, with the composite block of the environment, it is possible to determine what can be safely changed without conflicting with other components in parent cells.

Certain embodiments of the present invention are directed at computer programs that process computer data used to control the manufacturing equipment that mass-produces micro-electronic devices. The programs search for specific pieces of artwork and their associated composite blocks.

BRIEF DESCRIPTION OF THE DRAWINGS

The invention will be described in detail in the following description of embodiments with reference to the following figures wherein.

DETAILED DESCRIPTION

Figure 1:
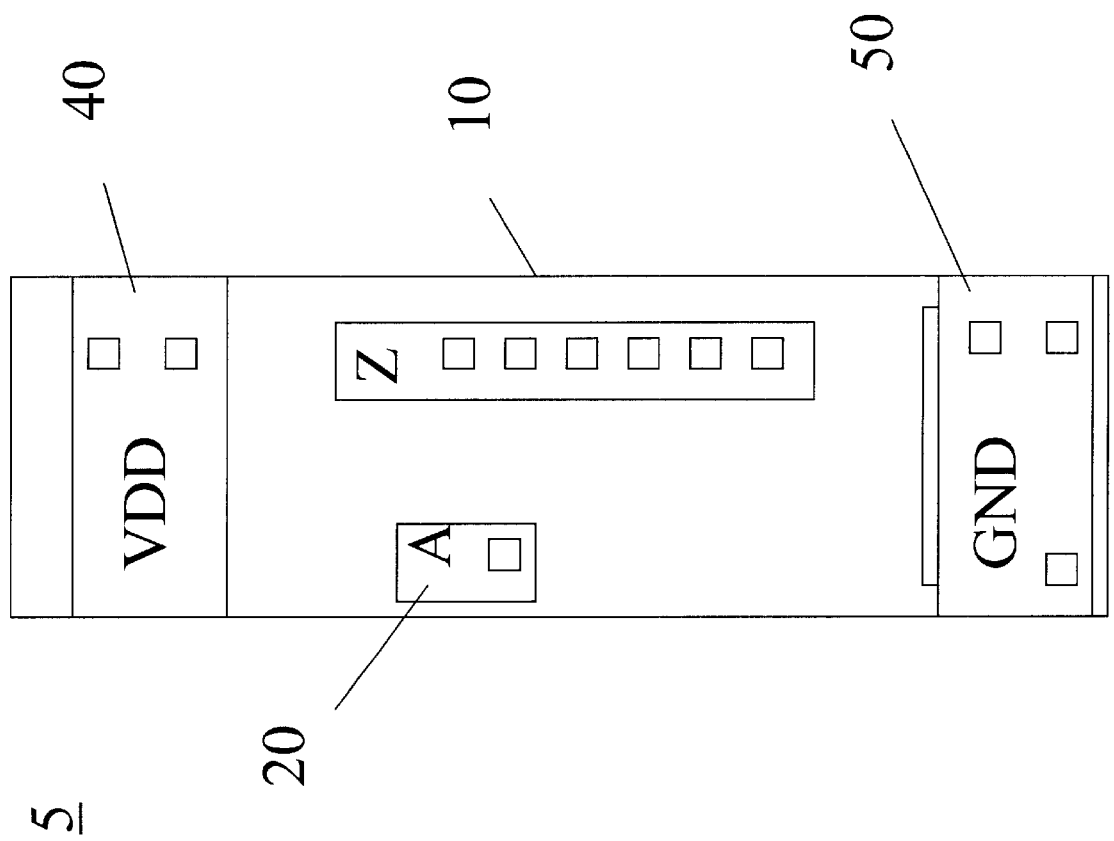
FIG. 1 illustrates the METAL 1 layer of a representative leaf cell in the form of a simple logic function.
Figure 2:
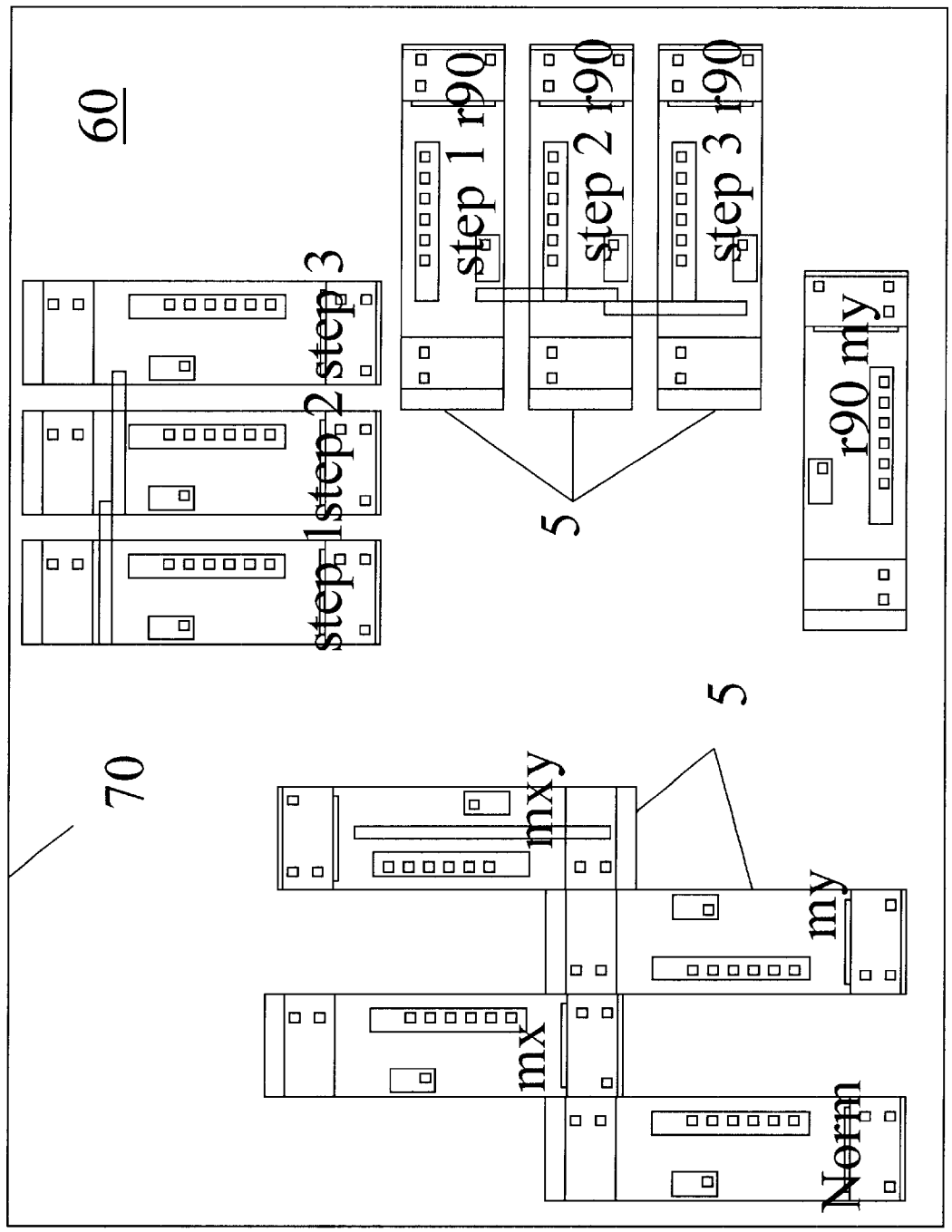
FIG. 2 illustrates a representative first-level parent cell that incorporates the leaf cell with added METAL 1 shapes illustrated in FIG. 1.

The semiconductor artwork illustrated in FIGS. 1 and 2 is typically manufactured by control software that specifies where the objects illustrated therein, including the METAL 1 layers, are to be positioned on semiconductor devices. Therefore, certain embodiments of the present invention are directed to tools and methods that analyze the software used to produce semiconductor artwork. These tools and methods find leaf cells and parent cells within existing artwork, then determine if porting of leaf cells or lower-level parent cells to new artwork will cause any design rule violations due to overlap of METAL 1 layers in the ported cell with layers in the new artwork.

Figure 4:
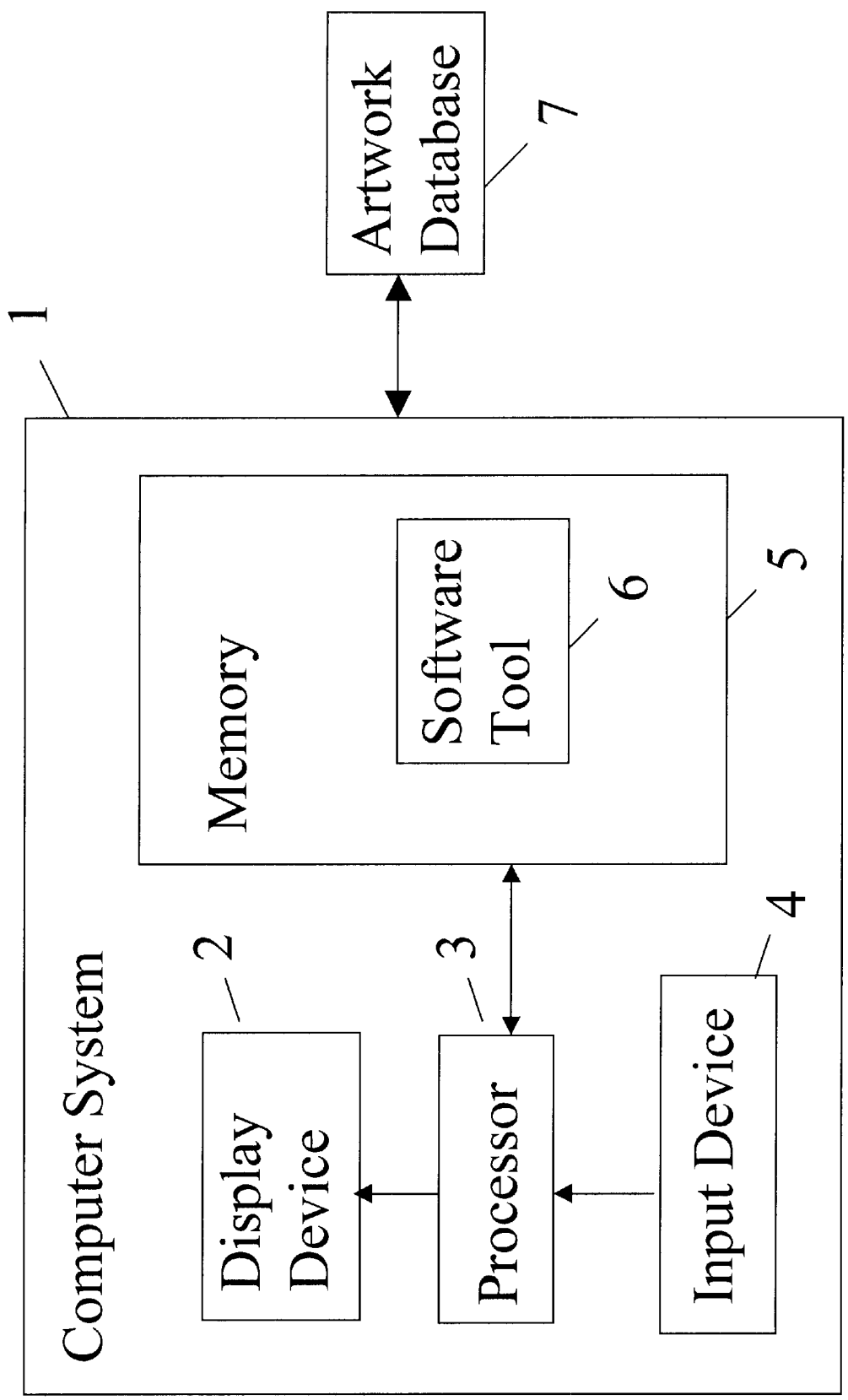
FIG. 4 illustrates an exemplary computer system 1 to execute methods of the present invention.

FIG. 4 illustrates an exemplary computer system 1 to execute methods of the present invention. Computer system 1 includes a display device 2, a processor 3, an input device 4, and a memory 5. Processor 3 can execute applications, such as a software tool 6, stored in memory 5. An artwork database 7 stores electronic representations of artwork for processing using software tool 6.

Figure 5:
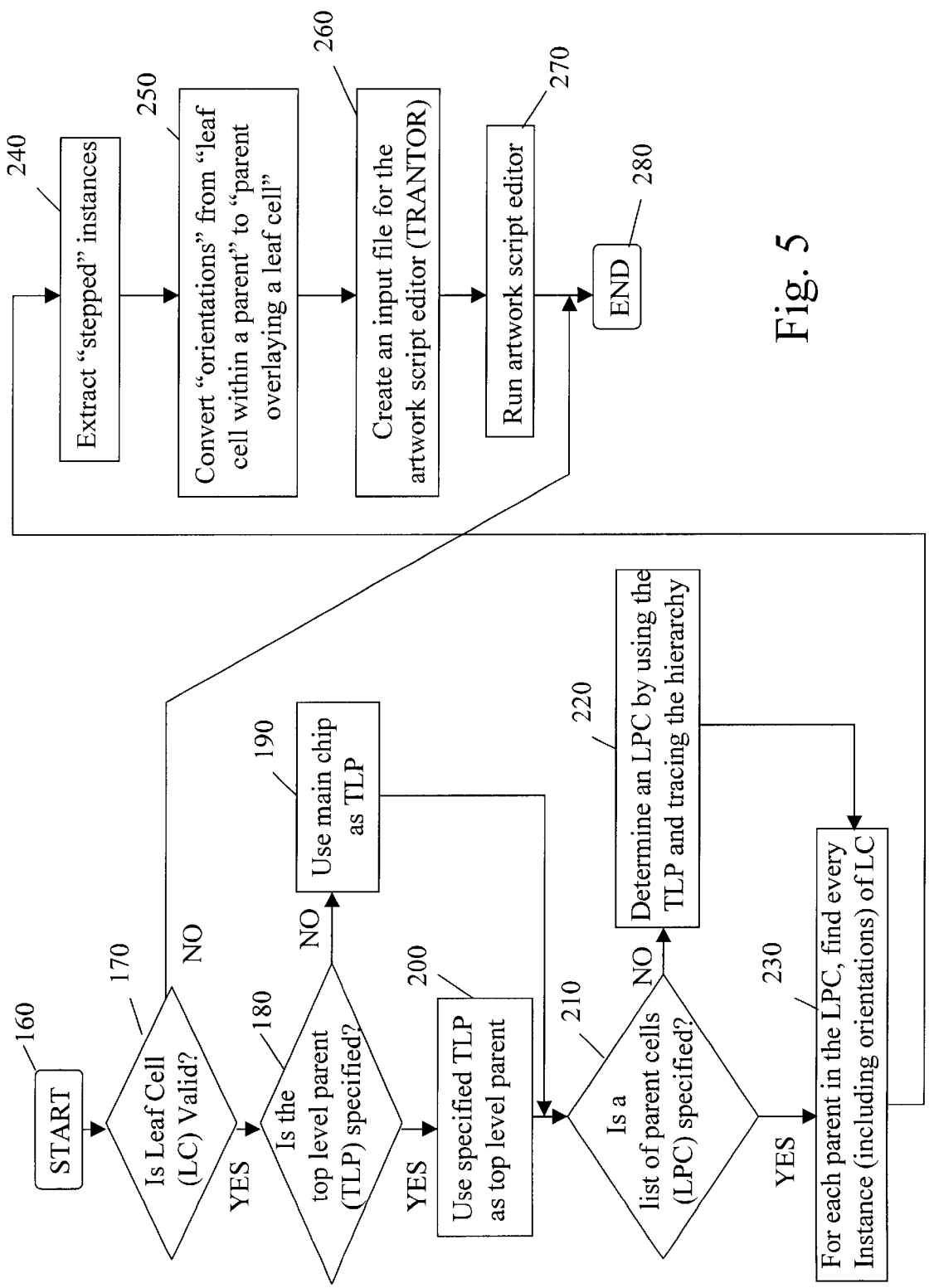
FIG. 5 contains a flowchart that details a process that identifies leaf cells and parent cells, mathematically transposes their coordinates such that the parent cells overlie the leaf cells, and creates an input file for an artwork script editor.

FIG. 5 illustrates a flowchart containing the steps of a process used by certain embodiments of the present invention. This process can be implemented by, for example, software tool 6 or other software modules or computer-readable media stored in memory 5 for execution by processor 3. This process analyzes the software used to produce an existing piece of semiconductor artwork and determines whether and how leaf cells and lower-level parent cells of the existing artwork can be used in a new piece of semiconductor artwork. In describing this process, reference is made to FIGS. 3A–3C.

After the process is initiated with the start step 160 and a leaf cell 80 to be searched for in the existing artwork is input by the user via input device 4, step 170 then questions whether the leaf cell 80 is valid. The leaf cell 80 would not be valid if it did not exist in the database 7 of the software that generates the existing piece of artwork from which the leaf cell 80 is being ported.

Step 170 is included as a "sanity check" to make sure that the process will flow correctly. If a user inputted an incorrect leaf cell 80 name, the name would not be found and the process can return an error message after skipping directly to the end of the flowchart. This check makes sure that the leaf cell 80 is actually in the database 7 and that there is an artwork representation for it.

The process illustrated in FIG. 5 allows a user to input many options via input device 4, including which top-level parent (TLP) of the existing artwork constitutes the boundary of the search for leaf cells. Step 180 of the flowchart determines whether the TLP cell over which to search has been specified.

Figure 3A:
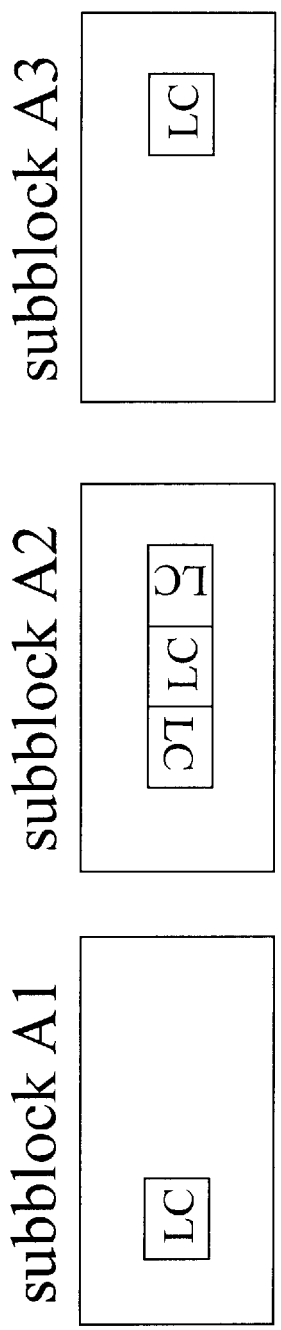
FIGS. 3A–3C illustrate more conceptually how leaf cells are included within first-order parents, how first-order parents are included within second-order parents, and how higher-order parents are included within devices.
Figure 3B:
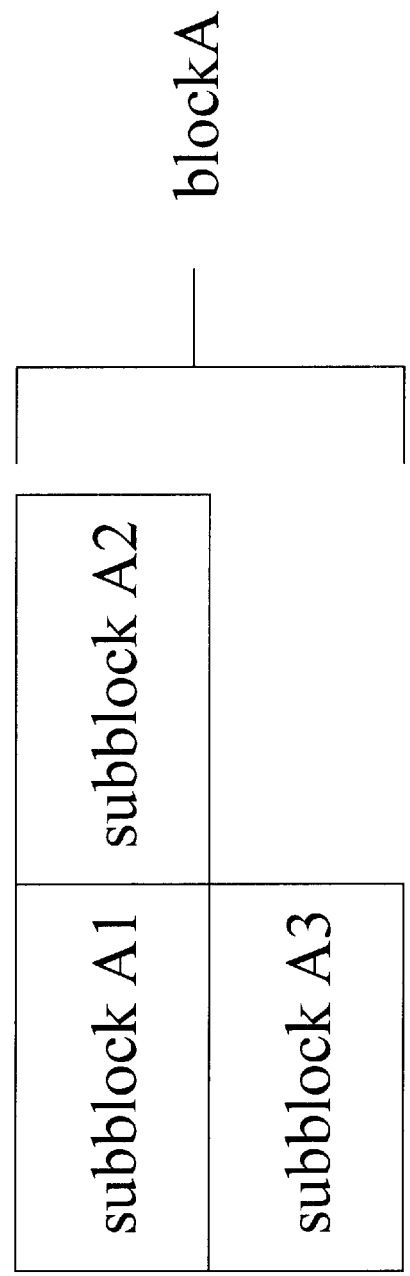
Figure 3C:
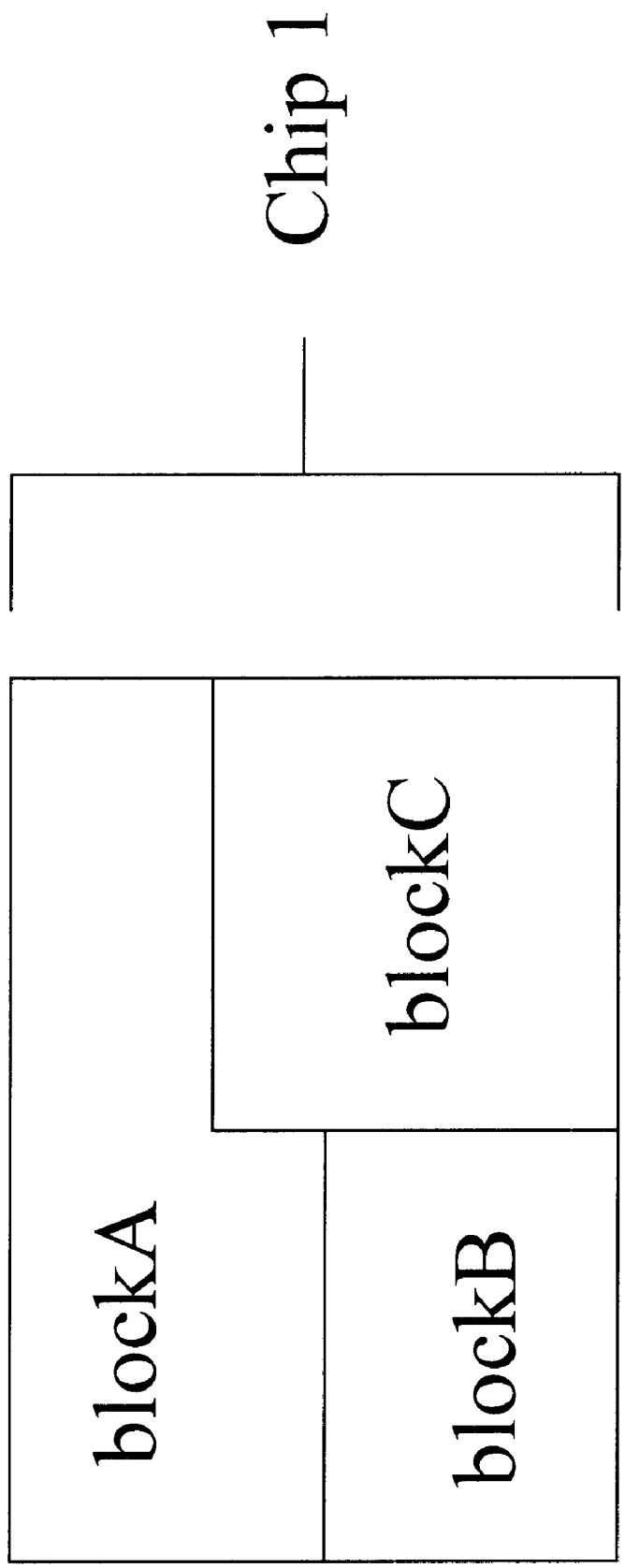

With reference to FIGS. 3A–3C, a user may wish to find all of the instances that leaf cells 80 appear in Chip1 150 or may want to restrict the search to blockA 120 or even to subblockA2 100. One reason to allow restricted searches is that they aid in the de-bugging process. Also, setting the appropriate search parameter improves run time. For example, if the user is only interested in analyzing blockA 120 for the presence of leaf cell 80, the program will not analyze the entire Chip1 150.

If the TLP parameter is not specified, the highest-level parent available (Chip1 150) is used as the default TLP parameter according to step 190. Otherwise, the specified TLP is used as the search boundary according to step 200.

Once the search boundary is established, step 210 detects whether a list of intermediate-level artwork or lower-level parent cells (LPC) within which to restrict the search of the TLP has been specified. Specifying an LPC list can also cut down on run time and aid in de-bugging for similar reasons to specifying a TLP. If an LPC list is not specified, a list of all of the LPC components within the TLP is generated according to step 220 and all items on the LPC list are searched.

An illustrative example is now given, taking into account that the sub-divisions of blockB 130 and blockC 140 have not been detailed to the extent that those of blockA 120 have been detailed. If no TLP is specified, Chip1 150 is chosen as the default TLP. Then, the LPC list, consisting of parents cells that are defined as being one hierarchical level above the LC, includes subblockA1 90, subblockA2 100, subblockA3 110, subblockB1 (not shown), subblockC2 (not shown) and blockC (not shown). If blockC 140 was specified as the TLP, then the LPC list would only include subblockC2 and blockC 140. However, the user could also decide, for various reasons, to make up a list limited to subblockA1 90, subblockB1 and blockC.

According to step 230, every occurrence of a leaf cell within every parent cell specified in the LPC list is then reported back and gathered in an archive file. If the leaf cell LC 80 were chosen as the leaf cell (sub-block) to be searched for and if Chip1 150 was the TLP, a partial list of the leaf cells 80 components and their hierarchy (represented by the arrows) would be reported back to the user via display device 2 as shown in Table 1:

TABLE 1

| |
|---|
| LC → subblockA1 → blockA → chip1 |
| LC → subblockA2 → blockA → chip1 |
| LC → subblockA3 → blockA → chip1 |
| LC → subblockB1 → blockB → chip1 |
| LC → subblockC2 → blockC → chip1 |
| LC → blockC → chip1 |

Similarly, if the leaf cell LC 80 were chosen as the sub-block to be searched for and if blockA 120 were the TLP, the components reported back to the user via display device 2 are shown in Table 2:

TABLE 2

| |
|---|
| LC → subblockA1 → blockA |
| LC → subblockA2 → blockA |
| LC → subblockA3 → blockA |

Step 230 also specifies that orientations of all of the leaf cells are to be reported and gathered in the archive file. This archive file may typically contain information detailing every component that exists within an existing piece of artwork such as, but not limited to, other leaf cells, metal-to-metal contacts, metal routes, notes, and other components. An example of a few lines of such an archive file, which may be stored in memory 5, are shown in Table 3 for a generic block:

TABLE 3

| | | |
|---|---|---|
| Add leaf_cell1 | 0, 0 | |
| Add leaf_cell2 | 25.2, 0 | |
| Add LC | 4, 0 | |
| Add Metal_1 | 3.4, 5.6 | 3.4, 10.6 |
| Add Note "Signal 1" | 0, 7.8 | |

Step 240 specifies that all stepped instances of a leaf cell also must be extracted. This step adds information to the archive file about cells that have been reproduced exactly at a different location.

Pursuant to steps 230 and 240, an example of a portion of the archive file detailing the components of FIGS. 3A–3C may include the information shown in Table 4.

TABLE 4

| | |
|---|---|
| From subblockA1 archive file | |
| Add LC | 0, 0 |
| From subblockA2 archive file | |
| Add LC | 5, 2 |
| Add LC:mxy | 5, 2 |
| Add LC:r90 | 10, 2 |
| From subblockA3 archive file | |
| Add LC:mx | 5, 10 |
| From subblockB1 archive file | |
| Add LC:r90 | 10, 0 |
| From subblockC2 archive file | |
| Add LC:mxy | 10, 20 |
| From blockC archive file | |
| Add LC:r90     :mx | 0, 10 |

Figure 6:
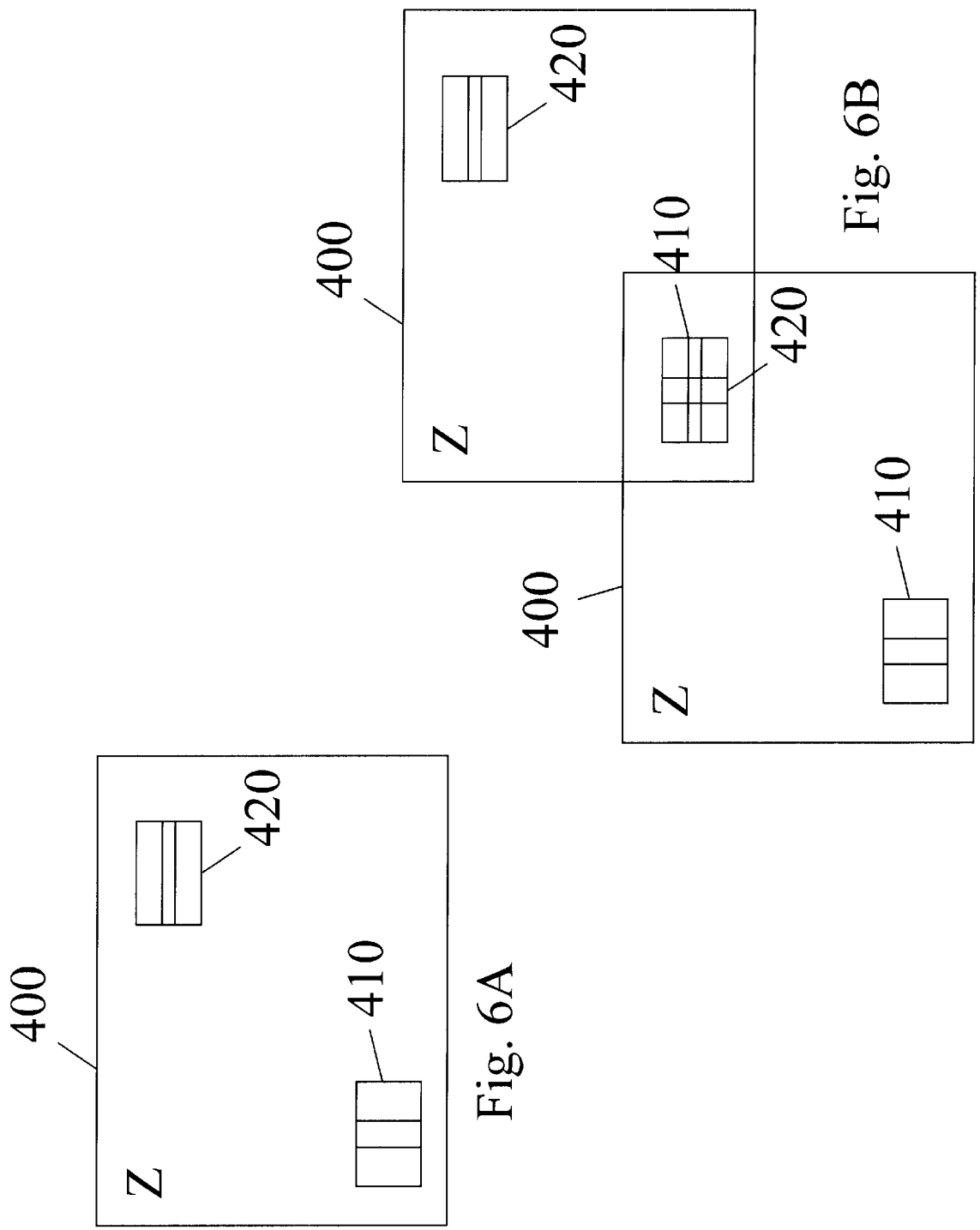
FIGS. 6A–6B illustrate the coordinate manipulation and parent cell overlay concept illustrated by the process of FIG. 5.

Once an archive file has been generated, step 250 specifies that the components listed in the file be rearranged such that the "leaf cell within a parent" representation illustrated in FIGS. 2 and 3A–3C be transformed into a "parent overlaying a leaf cell" representation illustrated in FIG. 6.

FIG. 6A illustrates a first leaf cell 410 and a second leaf cell 420 contained in a parent cell 400. According to the transformation specified in step 250 and illustrated in FIG. 6B, the first leaf cell 410 and the second leaf cell 420 are superimposed onto each other but each leaf cell keeps its relative position within parent cell 400. Hence, parent cell 400 is illustrated twice in FIG. 6B, one time overlain over the first leaf cell 410 and one time overlain over the second leaf cell 420.

In order to effectuate the transformation, an algorithm is performed on the lines of the archive file. The results of such an algorithm may be displayed as shown in Table 5:

TABLE 5

| | | |
|---|---|---|
| Add subblockA1: | | –0, –0 |
| Add subblockA2: | | –5, –2 |
| Add subblockA2: | mxy | 5, 2 |
| Add subblockA2: | r-90 | –2, –10 |
| Add subblockA3: | mx | –5, 10 |
| Add subblockB1: | r-90 | –0, 10 |
| Add subblockC2: | mxy | 10, 20 |
| Add blockC: | r90:mx | –10, –0 |

One example of a conversion algorithm is also illustrated by Table 6, which includes eight possible orientations and their corresponding conversions.

TABLE 6

| Conversion Table | |
|---|---|
| ORIENTATION | CONVERSION |
| #<x, y> => | <–x, –y> |
| #:mx <x, y> => | :mx <–x, y> |
| #:my <x, y> => | :my <x, –y> |
| #:mxy <x, y> => | :mxy <x, y> |
| #:r90 <x, y> => | :r-90 <–y, x> |
| #:r-90 <x, y> => | :r90 <y, –x> |
| #:r90 :mx <x, y > => | :r90 :mx <–y, –x> |
| #:r90 :my <x, y > => | :r90 :my <y, x> |

After the conversion, step 260 specifies that the data in the archive file be re-formatted into an input file for an artwork script editor or shape manipulation tool. Typically, the TRANTOR program is the shape manipulation tool used, but other editors and tools also fall within the scope of certain embodiments of the present invention. Further, it is within the scope of certain embodiments of the present invention that no conversion will be necessary where the transformation data is already in a format useable by the script editor.

A "shape manipulation tool" is usually a tool used for physical verification. This tool ensures that the shapes are wide/long (length) enough, big enough (area), spaced apart far enough (spacing). This tool usually can do the following to shapes:

1) Union (or)
2) Intersection (and)
3) Difference (and not, minus)
4) Size up or size down
5) Do area/spacing/width checks Some industry tools such as the DRACULA program from Cadence and the HERCULES program from Avant are examples of these kinds of tools and other such tools may also be used.

Step 270 then specifies that the artwork script editor is used in order to generate the new artwork. A representative but non-limiting process flowchart by which the artwork script editor generates new artwork is further illustrated in FIG. 7. This process begins when the name of a leaf cell that was part of an existing piece of semiconductor artwork but that is to be used in a new piece of artwork is identified.

Figure 7:
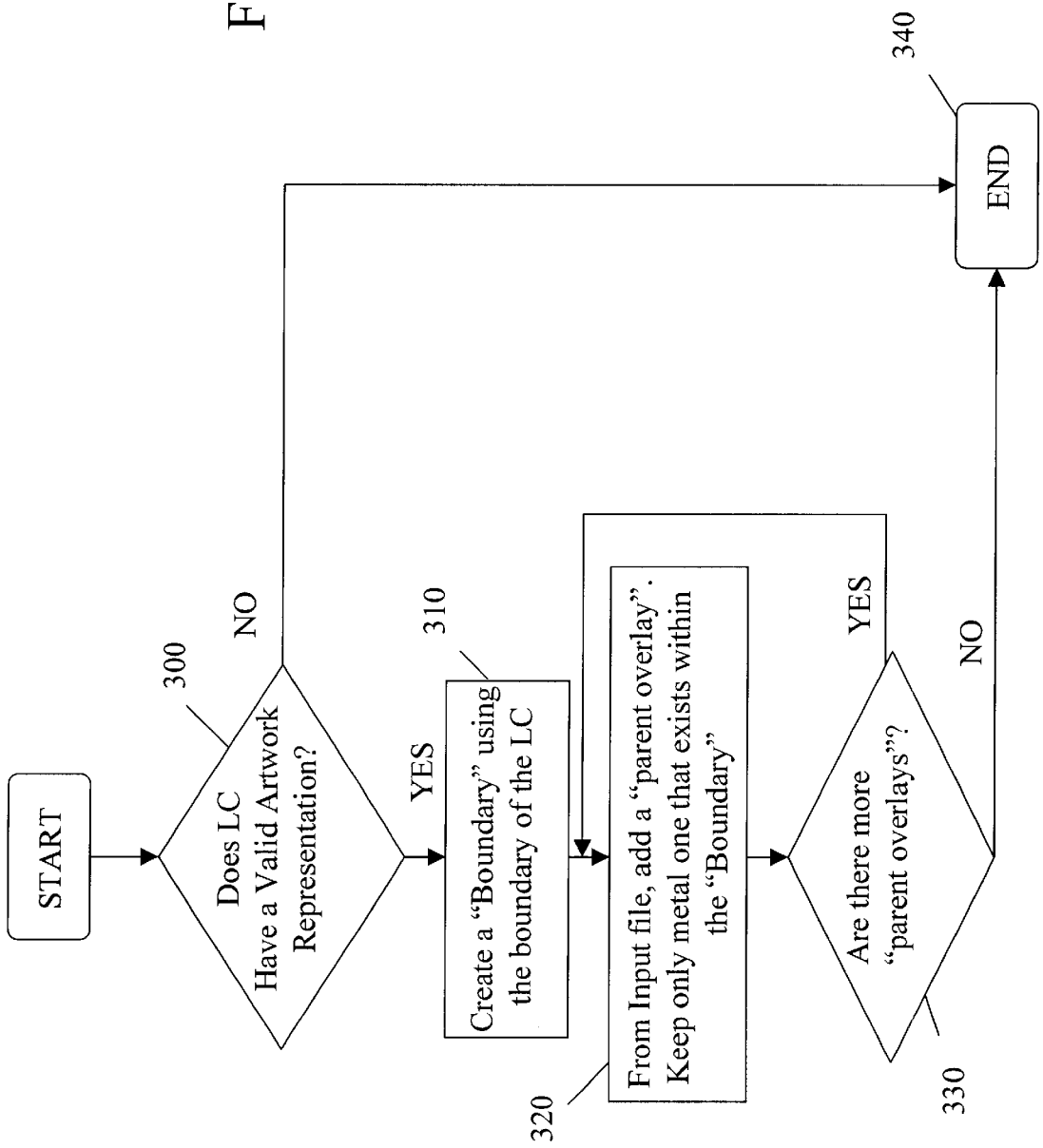
FIG. 7 contains a flowchart that details a process for overlaying parent cells over a fixed boundary of a leaf cell and recording the positions of all of the METAL 1 layers of the parent cells that intersect the leaf cell boundary.

According to the process flowchart illustrated in FIG. 7, step 300 specifies that a check be performed of whether the leaf cell input into the artwork script editor has a valid artwork representation. This step is another kind of check to verify the existence of the leaf cell. If the leaf cell does not pass the check, the process ends according to step 340.

Otherwise, according to step 310, a transformed leaf cell boundary is created using the leaf cell boundary. Then, according to step 320, the transformation process discussed above is performed for each leaf cell 410, 420 and parent cell 400 and all METAL 1 layers are then present inside the transformed leaf cell boundary are recorded. Step 330 then searches for more parent cells until all transformation operations have been performed. Once all transformations have been performed, the process ends.

Figure 8:
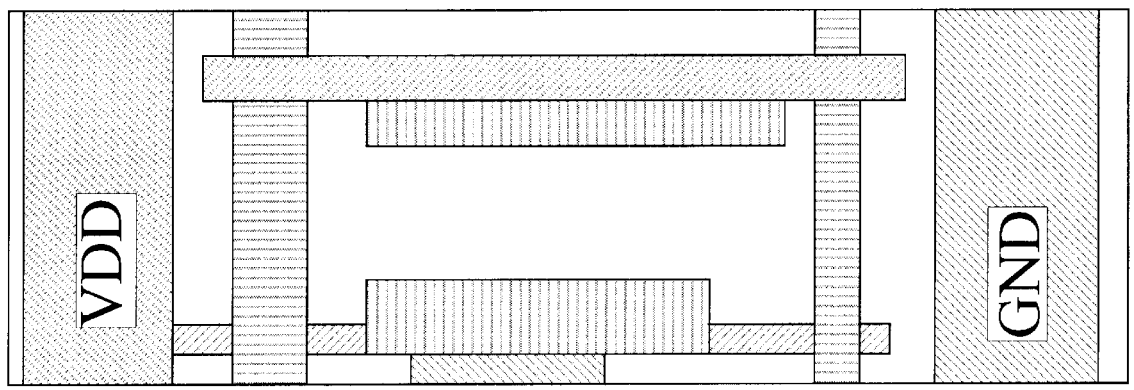
FIG. 8 schematically illustrates the results of the process detailed in the flowchart in FIG. 7.

FIG. 8 illustrates a representative final product that is created by the process illustrated in FIG. 7. Transformed boundary 400 surrounds all of the METAL 1 layers captured from all of the overlain parent cells. FIG. 8 shows that, by performing the above-described operations, knowledge is gained of where METAL 1 is used within a parent cell in relation to a leaf cell and where the METAL 1 can be moved inside the leaf cell. This is the actual result of the leaf cell illustrated in FIG. 1 being run on the parent cell in FIG. 2.

Because of the design rules, two METAL 1 shapes must have a certain gap separating each other. Hence, it is desirable to know where METAL 1 layers exist in the parent cells over the leaf cells. Having generated the shape of FIG. 8, it is now possible to look at the shapes of the captured metal layers and to determine, for example, through visual inspection, that these can be moved a little bit down without interfering with another metal shape, but that it cannot be moved to the right or left in this example. Hence, some embodiments of the present invention allow for the generation and display of a stencil-like pattern where an object can be moved without interfering with upper-level components and creating design rule violations.

Having described embodiments of a novel surface gated photodiode and a method for the producing thereof (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims and their equivalents.

What we claim is:

1. A method for designing semiconductor artwork comprising:
    selecting a lower-level artwork abstraction in an existing, higher-order artwork abstraction;
    determining a boundary within the existing, higher-order artwork abstraction in which to search for the lower-level artwork abstraction;
    recording coordinates of the lower-level artwork abstraction within the boundary;
    converting the coordinates of the lower-level artwork abstraction and of the existing, higher-order artwork abstraction to represent the existing, higher-order artwork abstraction overlaying the lower-level artwork abstraction; and
    generating semiconductor artwork using the converted coordinates, wherein the generated semiconductor artwork includes the lower-level artwork abstraction moved within the higher-order artwork abstraction.

2. The method of claim 1, wherein the selecting step comprises accepting input from a user to determine the selected lower-level artwork abstraction.

3. The method of claim 1, wherein the selecting step comprises selecting a metal layer as the lower-level artwork abstraction.

4. The method of claim 1, wherein the determining step comprises accepting input from a user to determine the boundary.

5. The method of claim 4, wherein the determining step further comprises accepting input from the user of an intermediate-level artwork abstraction within the boundary within which to search.

6. The method of claim 1, wherein the recording step further comprises recording the orientation of the lower-level artwork abstraction.

7. The method of claim 1, wherein the converting step comprises performing at least one of the following operations: mirroring, translating and rotating the coordinates.

8. The method of claim 1, wherein the generating step comprises inputting the converted coordinates into a shape manipulation tool.

9. A computer-readable medium comprising a plurality of modules to control a processor, the modules including:
    a selection module for selecting a lower-level artwork abstraction in an existing, higher-order artwork abstraction;
    a determination module for determining a boundary within the existing, higher-order artwork abstraction in which to search for the lower-level artwork abstraction;
    a recorder module for recording coordinates of the lower-level artwork abstraction within the boundary;
    a conversion module for converting the coordinates of the lower-level artwork abstraction and of the existing, higher-order artwork abstraction to represent the existing, higher-order artwork abstraction overlaying the lower-level artwork abstraction; and
    an application module for using the converted coordinates to generate semiconductor artwork wherein the lower-level artwork abstraction is moved within the higher-order artwork abstraction.

10. The computer-readable medium of claim 9, wherein the selection module accepts input from a user to determine the lower-level artwork abstraction selected.

11. The computer-readable medium of claim 9, wherein the lower-level artwork abstraction comprises a metal layer.

12. The computer-readable medium of claim 9, wherein the determination module accepts input from a user to determine the boundary.

13. The computer-readable medium of claim 12, wherein the determining module accepts input from the user of an intermediate-level artwork abstractions within the boundary within which to search.

14. The computer-readable medium of claim 9, wherein the recording module records the orientation of the lower-level artwork abstraction.

15. The computer-readable medium of claim 9, wherein the conversion module performs at least one of the following operations: mirroring, translating and rotating the coordinates.

16. The computer-readable medium of claim 9, wherein the application module inputs the converted coordinates into a shape manipulation tool.

17. The computer-readable medium of claim 9, further comprising:
a diagnostic module for determining if transferring the lower-level artwork abstraction to the semiconductor artwork will cause a design rule violation.

18. A computer program product, comprising:
a computer-readable medium containing instructions for controlling a computer system to perform a method, the method including:
selecting a METAL 1 layer from a leaf cell in an existing, higher-order parent cell;
determining a boundary within the parent cell in which to search for the leaf cell;
recording coordinates of leaf cells within the specified boundary;
converting the coordinates of the leaf cells and of the parent cell to represent the parent cell overlaying the leaf cells; and
generating semiconductor artwork using the converted coordinates, wherein the generated semiconductor artwork includes the lower-level artwork abstraction moved within the higher-order artwork abstraction.

19. The computer program product of claim 18, wherein the method further comprises:
transforming the converted coordinates into a format usable by a shape manipulation tool.

20. The computer program product of claim 18, wherein the generating step of the method further comprises inputting the converted coordinates into a shape manipulation tool.

* * * * *